United States Patent
Hu et al.

(10) Patent No.: US 8,710,458 B2
(45) Date of Patent: Apr. 29, 2014

(54) UV EXPOSURE METHOD FOR REDUCING RESIDUE IN DE-TAPING PROCESS

(75) Inventors: Yu-Hsiang Hu, Hsin-Chu (TW); Chen-Fa Lu, Gangshan Township (TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 719 days.

(21) Appl. No.: 12/907,711

(22) Filed: Oct. 19, 2010

(65) Prior Publication Data

US 2012/0091367 A1    Apr. 19, 2012

(51) Int. Cl.
*B32B 38/10* (2006.01)
*H01L 21/683* (2006.01)

(52) U.S. Cl.
CPC ..... *H01L 21/6836* (2013.01); *B32B 2310/0831* (2013.01)
USPC ............. 250/455.11; 250/492.1; 250/492.2; 156/275.5; 156/247; 156/379.5; 156/753; 438/464; 438/463

(58) Field of Classification Search
USPC .............. 250/492, 455.11; 156/275.5, 247, 156/379.6, 753, 750; 438/464, 463
See application file for complete search history.

(56) References Cited

U.S. PATENT DOCUMENTS

| | | | |
|---|---|---|---|
| 4,989,544 A * | 2/1991 | Yoshikawa | 118/723 MP |
| 6,663,792 B2 | 12/2003 | Fayfield et al. | |
| 7,091,499 B2 * | 8/2006 | Okawa | 250/455.11 |
| 2001/0044211 A1 | 11/2001 | Geusic et al. | |
| 2003/0088959 A1 | 5/2003 | Tsujimoto | |
| 2008/0210270 A1 | 9/2008 | America et al. | |
| 2008/0315133 A1 | 12/2008 | Jung et al. | |

FOREIGN PATENT DOCUMENTS

| | | |
|---|---|---|
| CN | 101246808 A | 8/2008 |
| TW | 575900 B | 2/2004 |

* cited by examiner

*Primary Examiner* — Jack Berman
(74) *Attorney, Agent, or Firm* — Slater & Matsil, L.L.P.

(57) ABSTRACT

A method of forming an integrated circuit includes providing a wafer, and a tape adhered to the wafer, wherein the tape has a main surface perpendicular to a first direction. The tape is exposed to a light to cause the tape to lose adhesion. In the step of exposing the tape, the wafer and the tape are rotated, and/or the light is tilt projected onto the tape, wherein a main projecting direction of the light and the first direction form a tilt angle greater than zero degrees and less than 90 degrees.

16 Claims, 10 Drawing Sheets

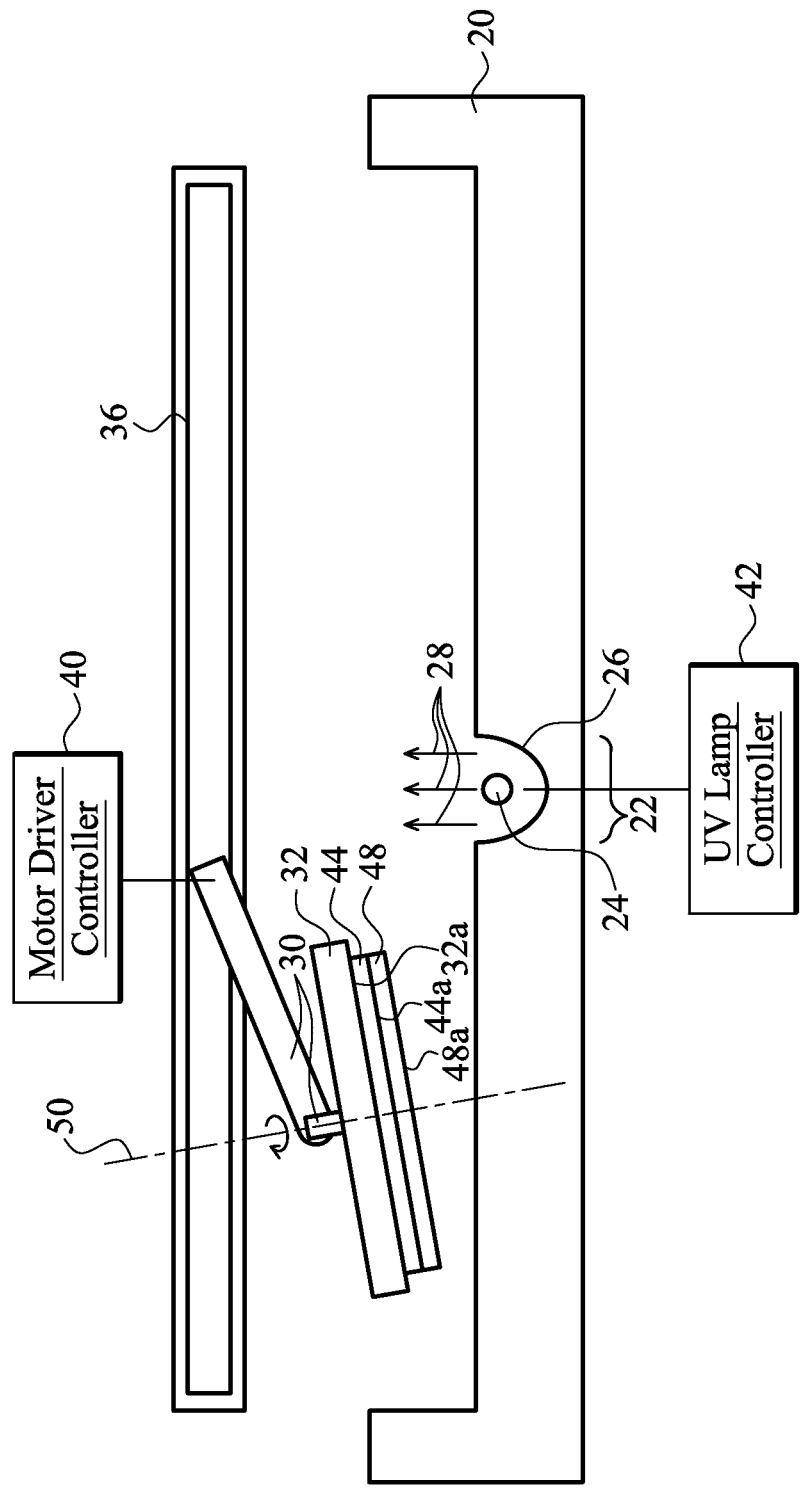

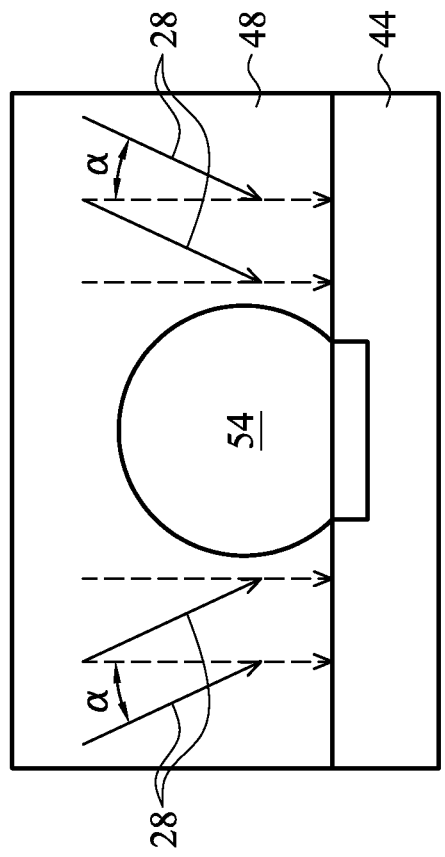
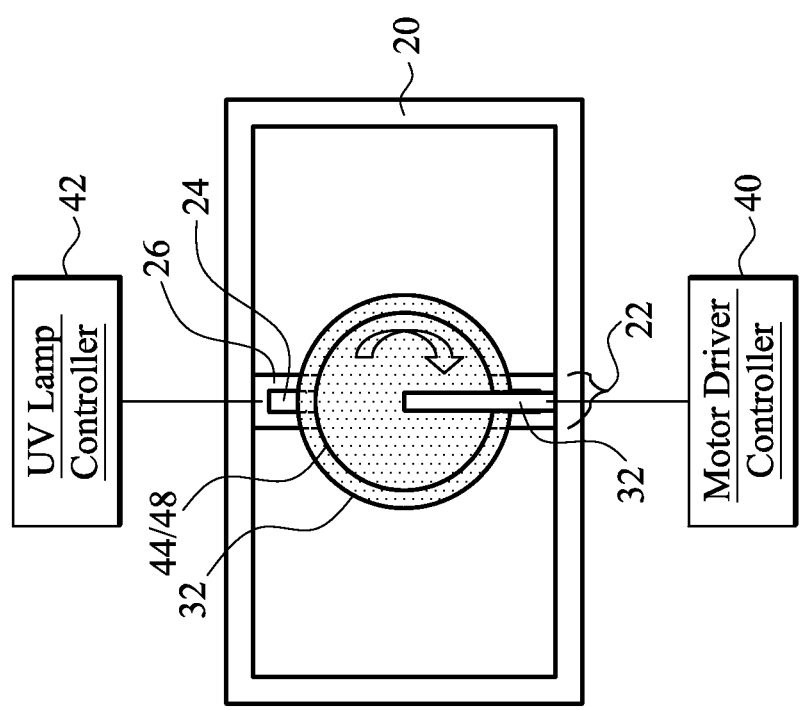
Fig. 7
Fig. 6

US 8,710,458 B2

UV EXPOSURE METHOD FOR REDUCING RESIDUE IN DE-TAPING PROCESS

BACKGROUND

Semiconductor wafers and chips are sometimes thinned for packaging processes. To thin a semiconductor wafer, a ultraviolet (UV) tape is adhered to a front side of the semiconductor wafer. A backside grinding is then performed to the backside of the semiconductor wafer, until the thickness of the semiconductor wafer reaches a desirable value. After the backside grinding, the UV tape is subject to a UV exposure using UV light, so that the UV tape can be removed from the semiconductor wafer.

In conventional UV exposure processes, a UV lamp is placed on a platform, with the UV light being projected upward. The UV lamp has a strip shape. The semiconductor wafer is positioned over the UV lamp, and is initially located at a position not subject to the UV exposure. The semiconductor wafer then moves directly over the UV lamp, so that the UV tape, which faces the UV lamp, is subjected to the UV exposure. The direction of the movement is perpendicular to the longitudinal direction of the UV lamp. The semiconductor wafer continuously moves forward, until it is no longer directly over the UV lamp. During the movement, the entire semiconductor wafer is subject to the UV light. After the UV exposure, the UV tape is removed from the semiconductor wafer.

In an alternative way of UV exposure, a UV lamp is placed facing upward, and the semiconductor wafer is positioned directly over the UV lamp, with the UV tape facing the UV lamp. The UV tape is subject to the UV exposure for a certain period of time. During the exposure, the semiconductor wafer remains not moved. After the UV exposure, the semiconductor wafer is removed from directly over the semiconductor wafer, and the UV tape is removed from the semiconductor wafer.

In the conventional de-taping processes, portions of the UV tape may not receive adequate UV exposure. As a result, UV residue may be left on the semiconductor wafer. For example, the portions of the UV tape on edges of the semiconductor wafer are often not exposed adequately. Further, ball grid array (BGA) balls may be formed on the surface of the semiconductor wafer, and are in contact with the UV tape. BGA balls do not have vertical sidewalls, and portions of the BGA balls may block the UV light from being projected on some portions of the UV tape. As a result, the portions of the UV tape blocked from the UV light are also not exposed to UV light adequately. This cause residue of the UV tape to be left on the semiconductor wafer after the removal of the UV tape. The Residue of the UV tape may cause yield loss in subsequent packaging processes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 3 are cross-sectional views of intermediate stages in the light exposure of a ultra-violet (UV) tape in accordance with an embodiment, wherein the UV tape rotates and moves during the UV exposure;

FIGS. 5 and 6 illustrate a cross-sectional view and a top view, respectively, of a UV exposure in accordance with alternative embodiments, wherein a UV tape rotates, but does not move forward, during the UV exposure;

FIG. 7 illustrates that UV light is projected to the UV tape from different angles;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of performing light exposure steps to tapes on semiconductor wafers is presented in accordance with an embodiment. The variations of the embodiment are discussed. Throughout the various views and illustrative embodiments, like reference numbers are used to designate like elements. Throughout the description, the de-taping of ultra-violet (UV) tapes, which are exposed to UV light, are used as examples. The teaching of the present disclosure, however, may be used for other types of tapes that are exposed to different types of lights.

Figure 1:
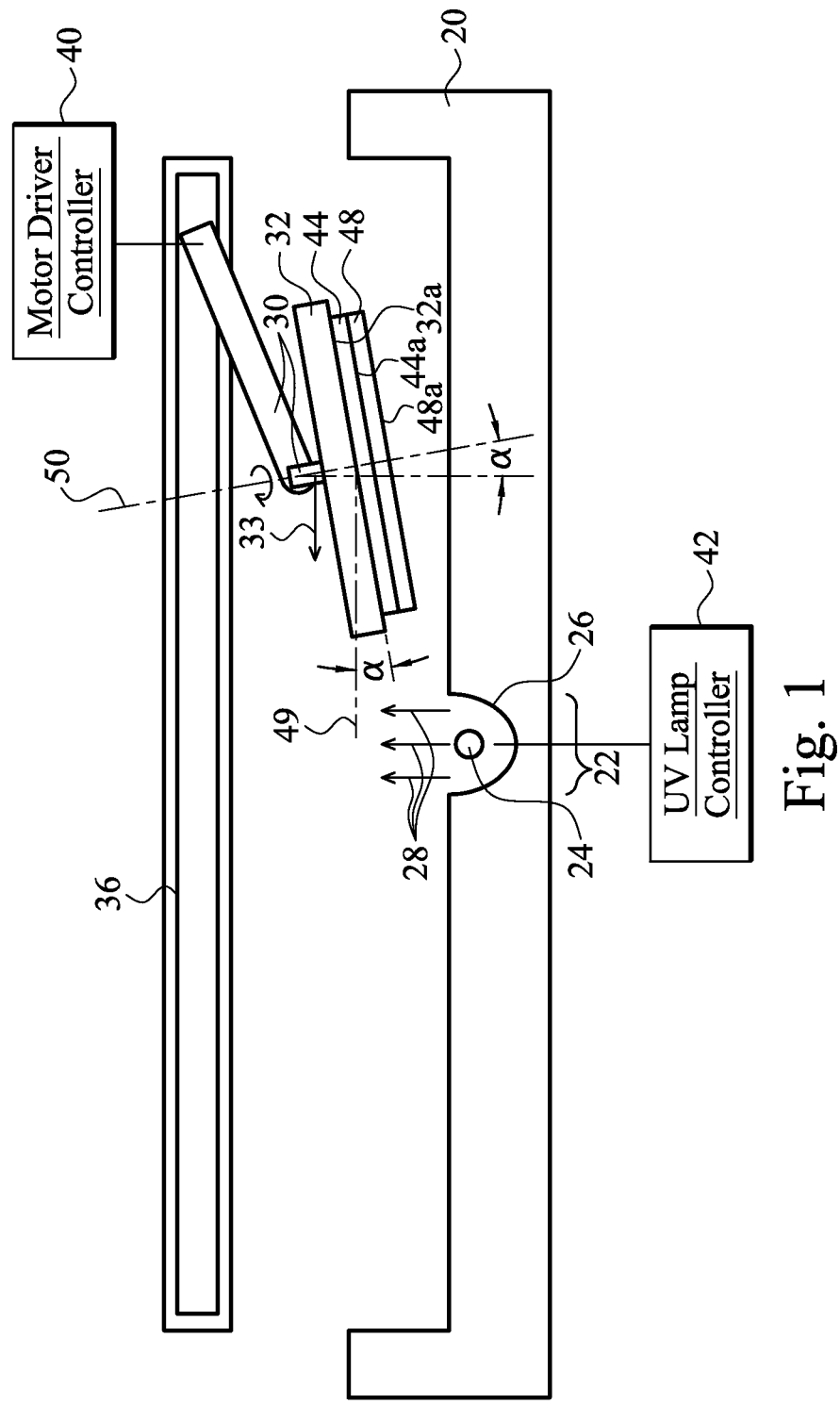
Figure 4:
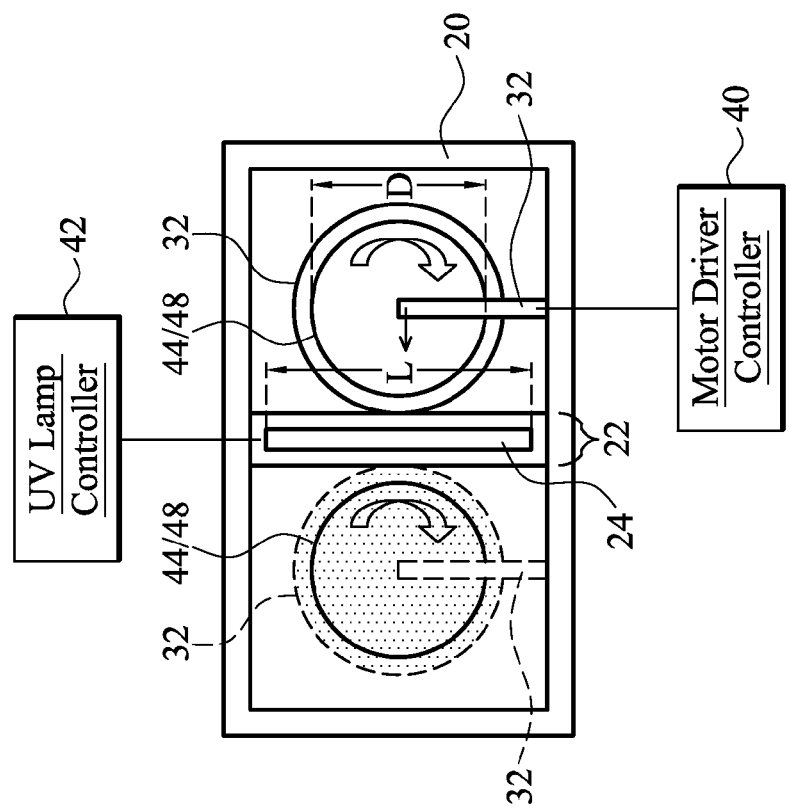
FIG. 4 illustrates a top view of the process shown in FIGS. 1 through 3.

FIGS. 1 through 4 illustrate a light exposure process of a tape in accordance with an embodiment. Referring to FIG. 1, a cross-sectional view of a light-exposure apparatus is illustrated. The light-exposure apparatus includes UV lamp module 20, and UV lamp 22 in UV lamp module 20. UV lamp 22 further includes UV light source 24 for emitting a UV light, and reflector 26 for reflecting the UV light. Reflector 26 may have a curved surface that is smooth, so that the reflected UV light 28 may be substantially in the upward direction, with a small percentage of the UV light, if any, in directions other than the upward direction. Throughout the description, the main direction that the UV light is projected toward is referred to as the main UV light direction. In the example shown in FIG. 1, the main UV light direction is the upwardly vertical direction. UV lamp 22 may have the shape of a strip (refer to FIG. 4), with each of UV light source 24 and reflector 26 having the strip shape. The length L (FIG. 4) of UV lamp 22 may be equal to or greater than diameter D of wafer 44 (FIG. 4).

The light-exposure apparatus further includes transfer arm 30, wafer stage 32 attached to transfer arm 30, and possibly movement guide 36, which guides the movement of transfer arm 30 in movement direction 33. In the illustrated example in FIG. 1, movement direction 33 is the horizontal direction. Motor driver controller 40 is electrically coupled to transfer arm 30, and is configured to control the actions of transfer arm 30, which actions include the movement of transfer arm 30 along movement guide 36, the rotation of stage 32, and/or the tilting of stage 32. UV lamp 22 may also be controlled by UV lamp controller 42 to turn on and off, and/or to adjust the light intensity if needed.

Wafer 44 is mounted on stage 32, for example, using vacuum. UV tape 48 is adhered on wafer 44. In the beginning of the light-exposure process, stage 32 and wafer 44 may be on a side, for example, the right side as in FIG. 1, of UV lamp 22. Accordingly, UV tape 48 is not exposed to UV light 28. Stage 32, wafer 44, and UV tape 48 are tilted with relative to the horizontal direction, with tilt angle α being the angle between horizontal plane 49 (which is parallel to the movement direction 33 of stage 32) and the main surfaces 32a/44a/48a of stage 32, wafer 44, and UV tape 48. Alternatively stating, line 50, which is perpendicular to the main surfaces 32a/44a/48a, forms tilt angle α with the main UV light direction. In an embodiment, tilt angle α a is greater than 0 degrees and smaller than 90 degrees. In other embodiments, tilt angle α is greater than 0 degrees and smaller than about 45 degrees, and may be between about 10 degrees and about 45 degrees. Motor drive controller 40 may further control transfer arm 32 to rotate stage 32 and wafer 44 attached thereon. The rotation speed may range between about 10 rotations per minute (RPM) and about 2,000 RPM, although different rotation speeds may also be used. The rotation axis is shown as line 50, which axis is perpendicular to the main surfaces 32a/44a/48a. Alternatively, a vertical line parallel to the main UV light direction may be used as the ration axis.

Figure 2:
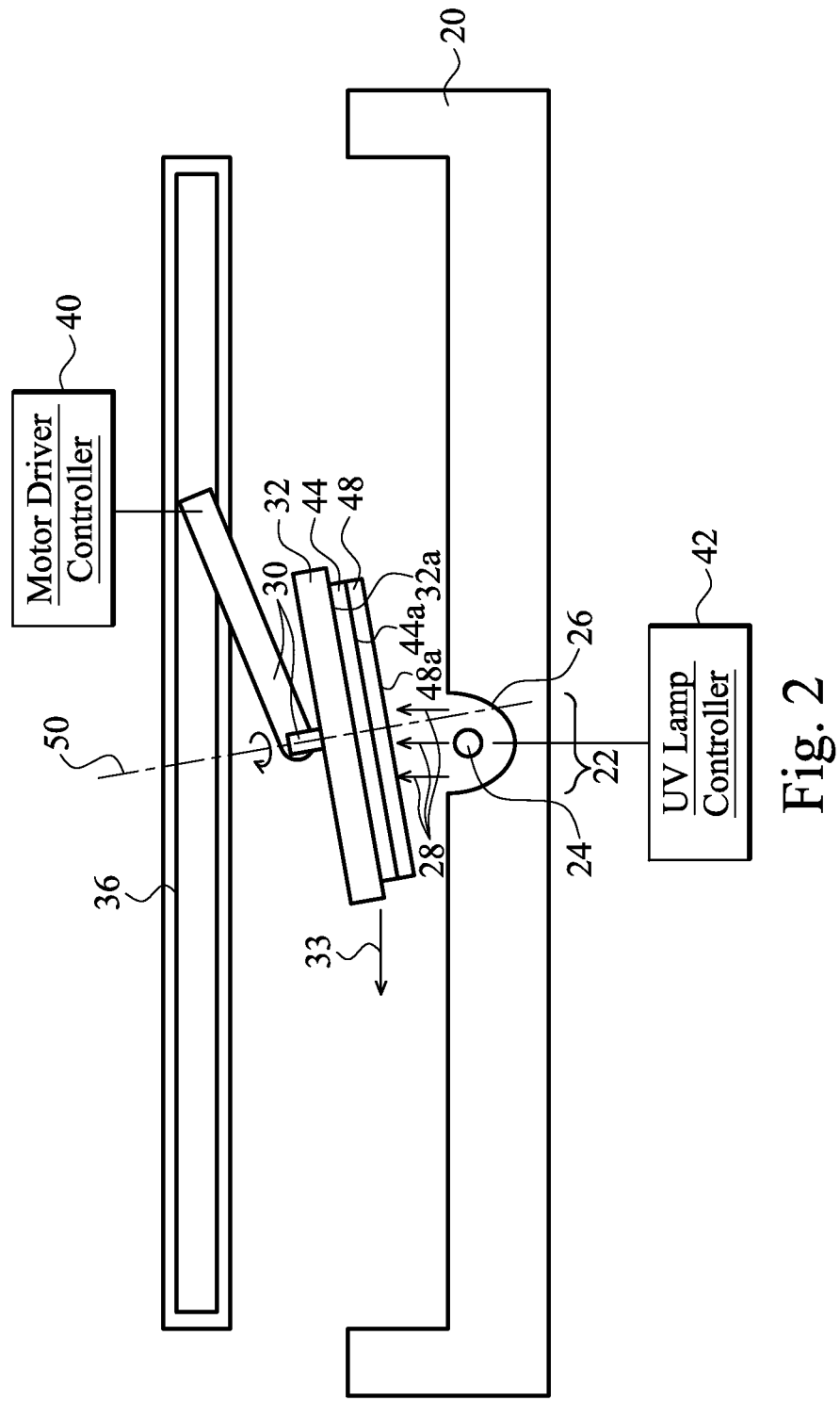

Referring to FIGS. 2 and 3, transfer arm 30 moves to the left along movement guide 36, wherein the movement direction is illustrated as arrow 33. During the movement, stage 32, wafer 44, and UV tape 48 continue to rotate. When UV tape 48 enters the range of UV light 28, as shown in FIG. 2, UV tape 48 is exposed by UV light 28 in a tilted way. An exemplary tilted exposure is illustrated in FIG. 7. Due to the rotation of UV tape 48, UV light 28 will be projected onto UV tape 48 from multiple directions, as shown as the exemplary UV light 28. Accordingly, ball grid array (BGA) ball 54, which is formed on the surface of wafer 44, will not cause shadow to UV light 28, and UV tape 48 may be fully exposed and loses adhesion.

As shown in FIG. 3, with the continue movement of transfer arm 30, wafer 44 and UV tape 48 eventually move out of the projection range of UV light 28, and the UV light exposure step may be ended. During substantially the entire movement and substantially the entire light exposure process, wafer 44 and UV tape 48 may be rotated. UV tape 48 may then be removed from wafer 44. Due to the no-shadow exposure, there is substantially no tape residue left on wafer 44.

FIG. 4 illustrates a top view of the UV light exposure process, wherein the wafer 44 and tape 48 on the right side of UV lamp 22 illustrate the position before the movement of wafer 44 and tape 48 starts, and the wafer 44 and tape 48 on the left side of UV lamp 22 illustrate the position after the movement of wafer 44 and tape 48 ends.

Figure 5:
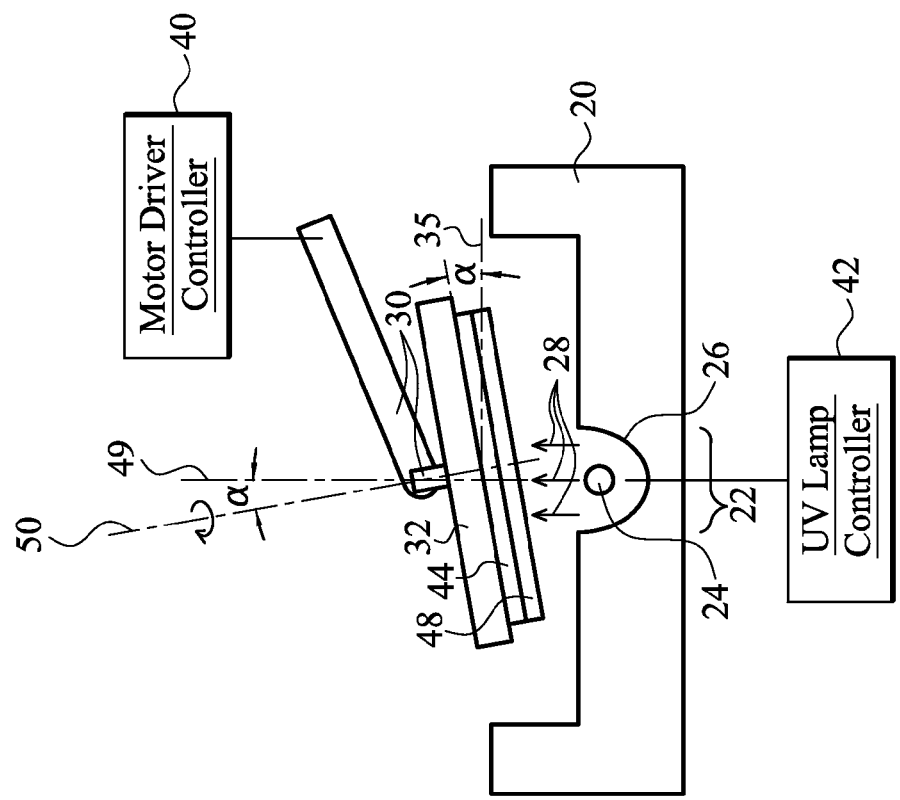

FIGS. 5 and 6 illustrate the exposure of UV tape 48 in accordance with an alternative embodiment. Unless specified otherwise, the reference numerals in this embodiment and the subsequently discussed embodiments represent like elements in the embodiments illustrated in FIGS. 1 through 4. Referring to FIG. 5, UV lamp 22 is in UV lamp module 20, with UV light 28 being projected upwardly. Stage 32, wafer 44, and UV tape 48 are disposed over UV lamp 22, and are subject to UV light 28. Again, stage 32, wafer 44, and UV tape 48 form tilt angle α with horizontal plane 35, wherein horizontal plane 35 is perpendicular to the main UV light direction of UV light 28. Different from the embodiment as shown in FIGS. 1 through 4, stage 32, wafer 44, and UV tape 48 do not move horizontally, and are rotated by transfer arm 30, for example, around axis 50 or vertical line 49. During the entire UV light exposure process, Stage 32, wafer 44, and UV tape 48 may make one or more rotations. After UV tape 48 is exposed to UV light 28 for a certain period of time, the UV light exposure step is ended. UV tape 48 may then be removed from wafer 44. The projection of UV light 28 may also be shown using FIG. 7, which illustrates that UV light 28 is projected onto UV tape 48 from different angles due to the rotation of wafer 44 and tape 48. FIG. 6 illustrates a top view of the embodiment as shown in FIG. 5.

Figure 8:
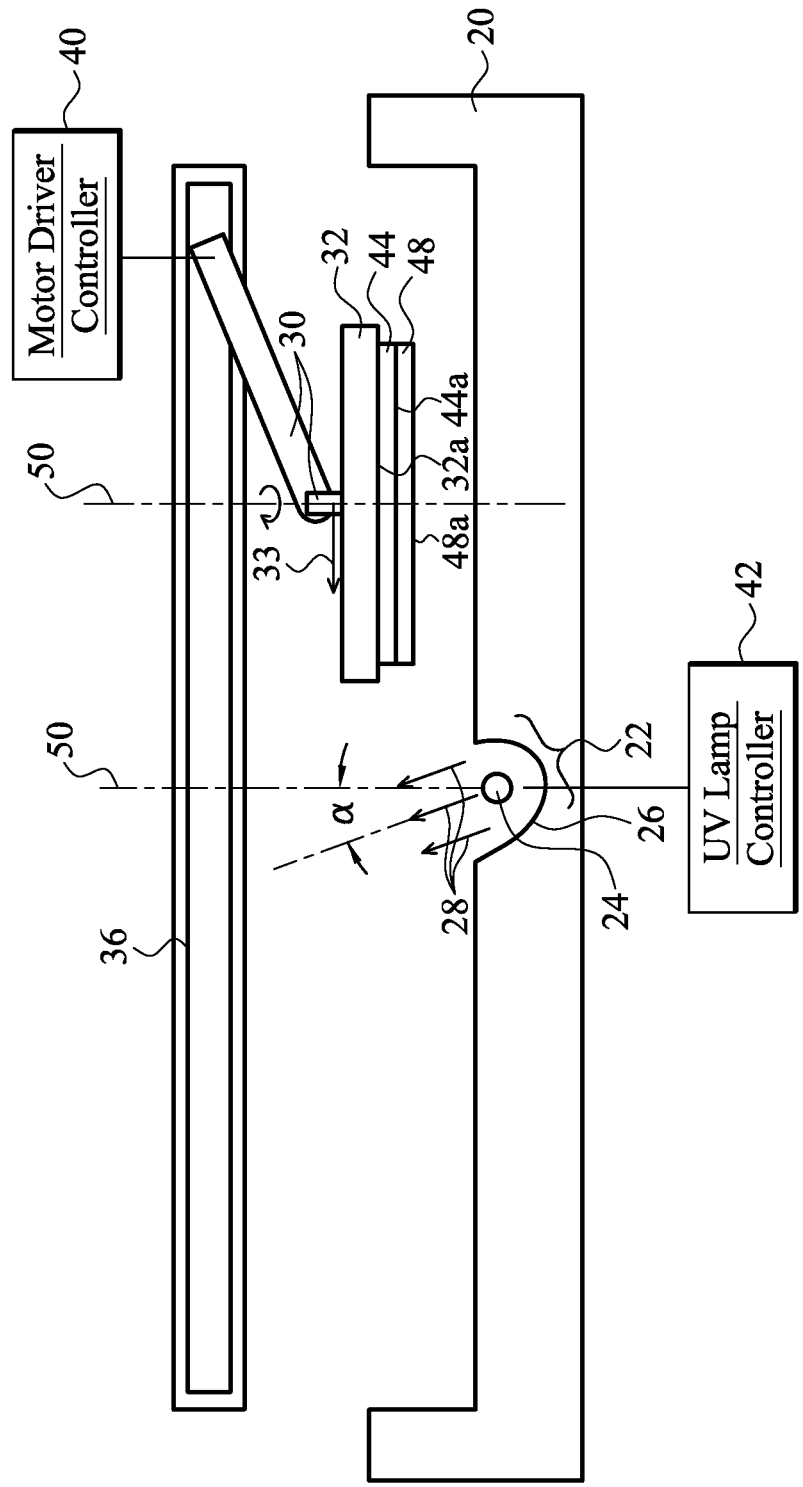
FIGS. 8 through 10 are cross-sectional views of intermediate stages in the exposure of a UV tape in accordance with alternative embodiments, wherein the UV tape rotates and moves during the UV exposure, and wherein the UV light is tilted.
Figure 9:
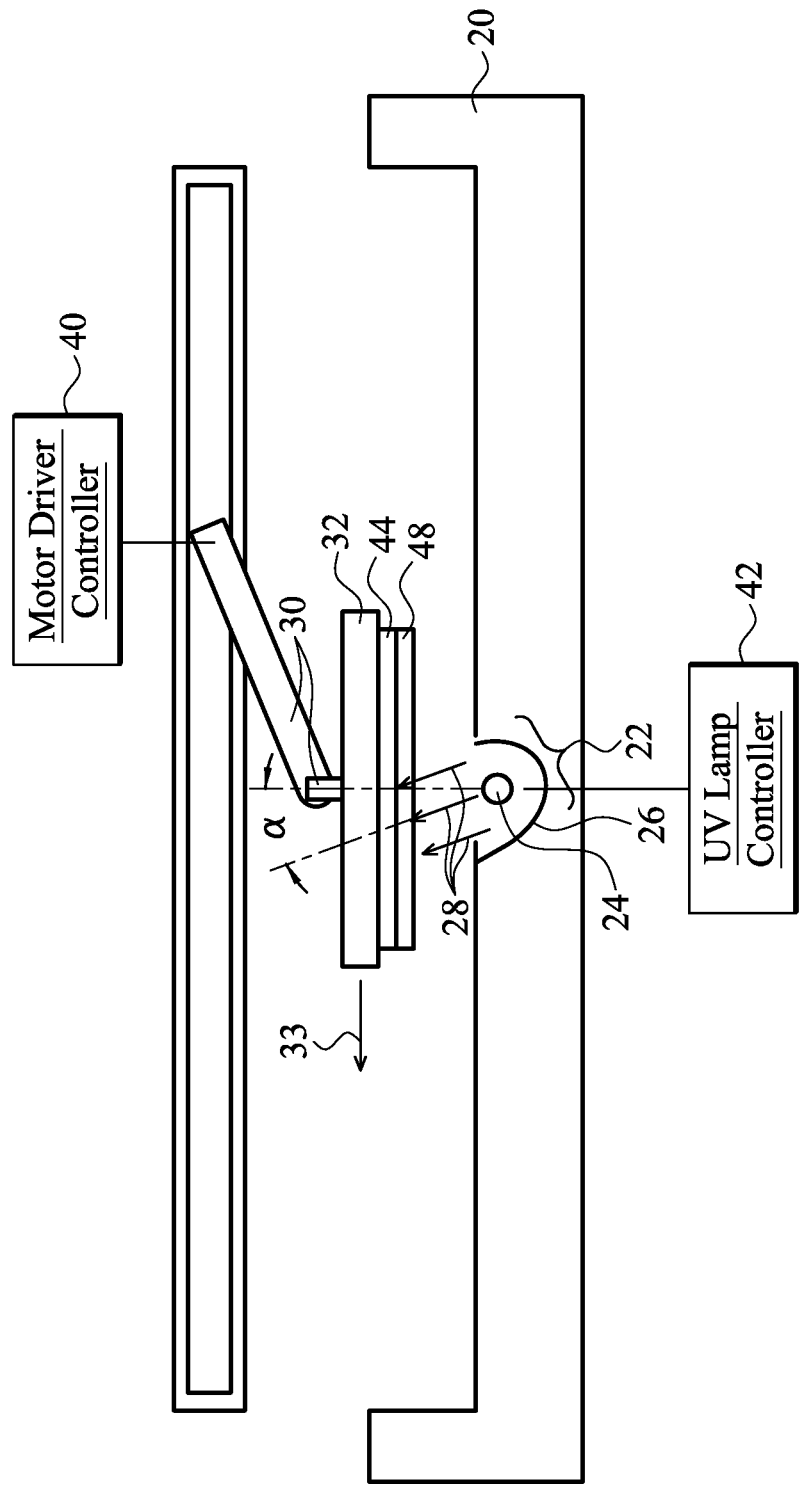
Figure 10:
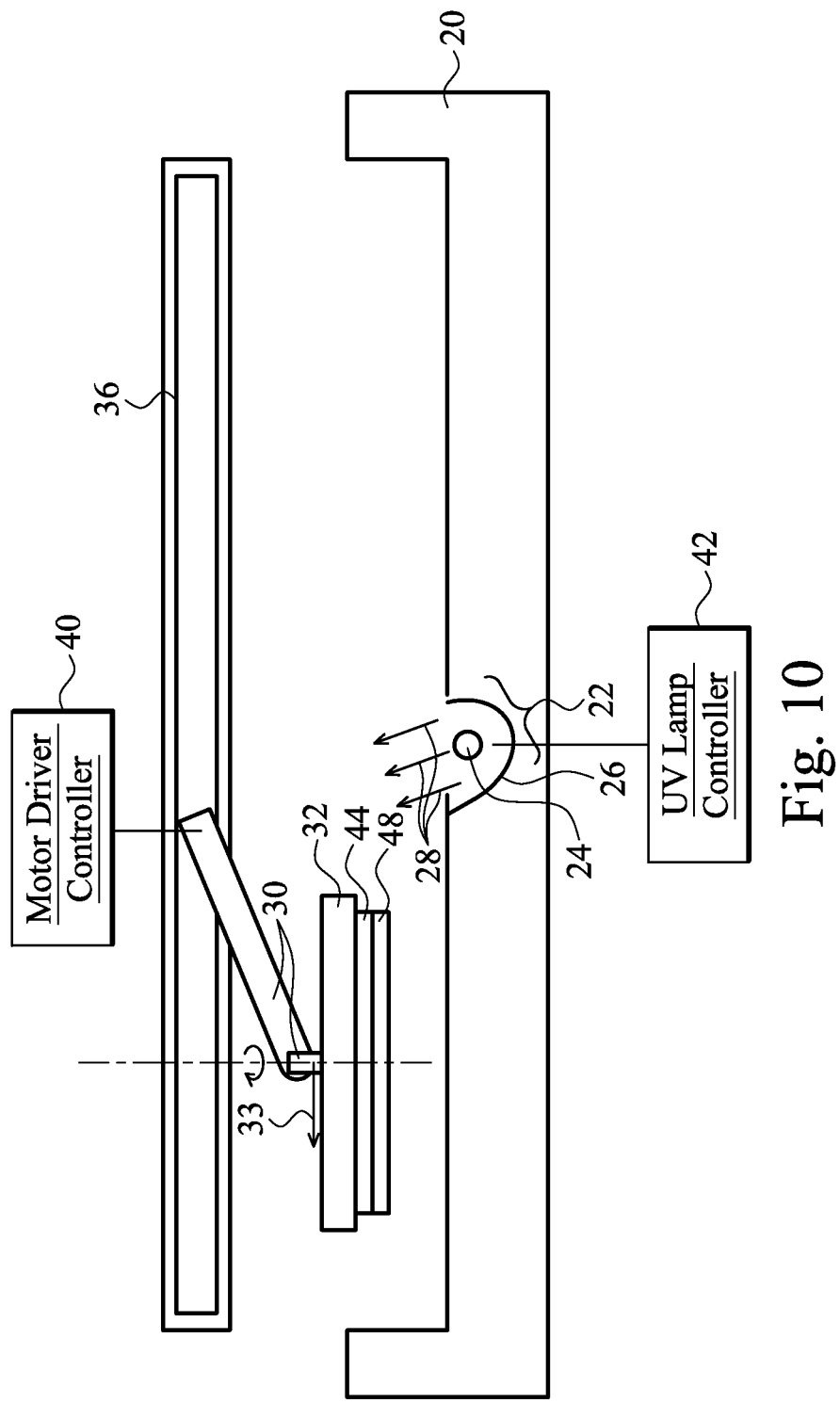

FIGS. 8 through 10 illustrate the exposure of tape 48 in accordance with yet other embodiments. In these embodiments, UV light 28 is still tilt projected onto UV tape 48 with tilt angle α. The tilt exposure, however, is achieved by tilting the main UV light direction of UV light 28. The main surfaces 32a, 44a, 48a of stage 32, wafer 44, and UV tape 48, respectively, are parallel to the movement direction 33, which may be the horizontal direction. During the light exposure process, stage 32, wafer 44, and UV tape 48 are also rotated. Line 50 is used to represent the axis of the rotation. Two axis 50 are illustrated with one crossing the center of the illustrated wafer 40, and the other located directly over UV lamp 22, which line 50 represents the rotation axis wafer 44 and tape 48 moves to directly over UV lamp 22. It is observed that the main UV light direction of UV light 28 and axis 50 form tilt angle α, which may have essentially the same value as the tile angle α in the embodiments illustrated in FIGS. 1 through 4.

Referring to FIG. 8, transfer arm 30 and wafer 44 start the movement from one side of UV lamp 22, and moves toward the opposite side. In the beginning, UV tape 48 may not be exposed to UV light 28. Stage 32, wafer 44, and UV tape 48 are rotated during the entire light exposure step and the entire movement of transfer arm 30 around axis 50. The movement of transfer arm 30 and the rotation are controlled by motor drive controller 40. The rotation speed may be in the same range as discussed in the embodiments shown in FIGS. 1 through 4, although different rotation speeds may be used.

Referring to FIGS. 9 and 10, transfer arm 30 moves forward (for example, to the left) along movement guide 36, until it is eventually out of the projection range of UV light 28. During the movement, stage 32, wafer 44, and UV tape 48 may keep on rotating. When UV tape 48 enters the range of UV light 28, as shown in FIG. 9, UV tape 48 is exposed by UV light 28 in a tilted way. Again, the tilt exposure may be illustrated using FIG. 7, which illustrates that UV light 28 is projected onto UV tape 48 from multiple directions due to the rotation and the tilting of the main UV light direction of UV light 28.

Figure 11:
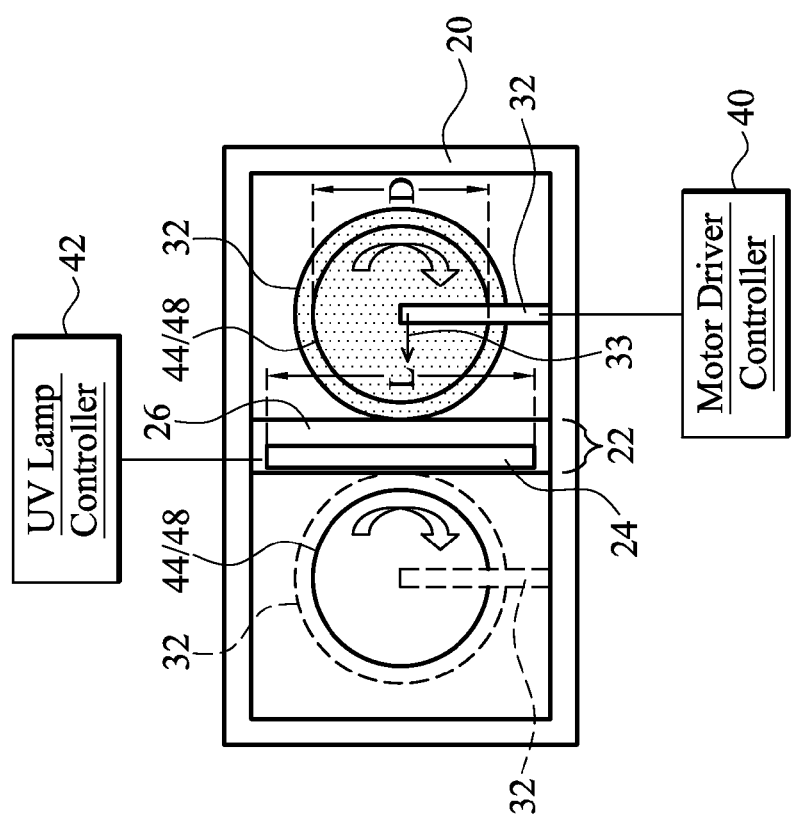
FIG. 11 illustrates a top view of the process shown in FIGS. 8 through 10.

As shown in FIG. 10, with the movement of transfer arm 30, wafer 44, and UV tape 48 move out of the projection range of UV light 28, and the UV light exposure step may be ended. During the entire movement, wafer 44 and tape 48 may be rotated. UV tape 48 may then be removed from wafer 44. Due to the no-shadow exposure, there is substantially no tape residue left on wafer 44. FIG. 11 illustrates a top view of the UV light exposure process as shown in FIGS. 8 through 10.

Figure 12:
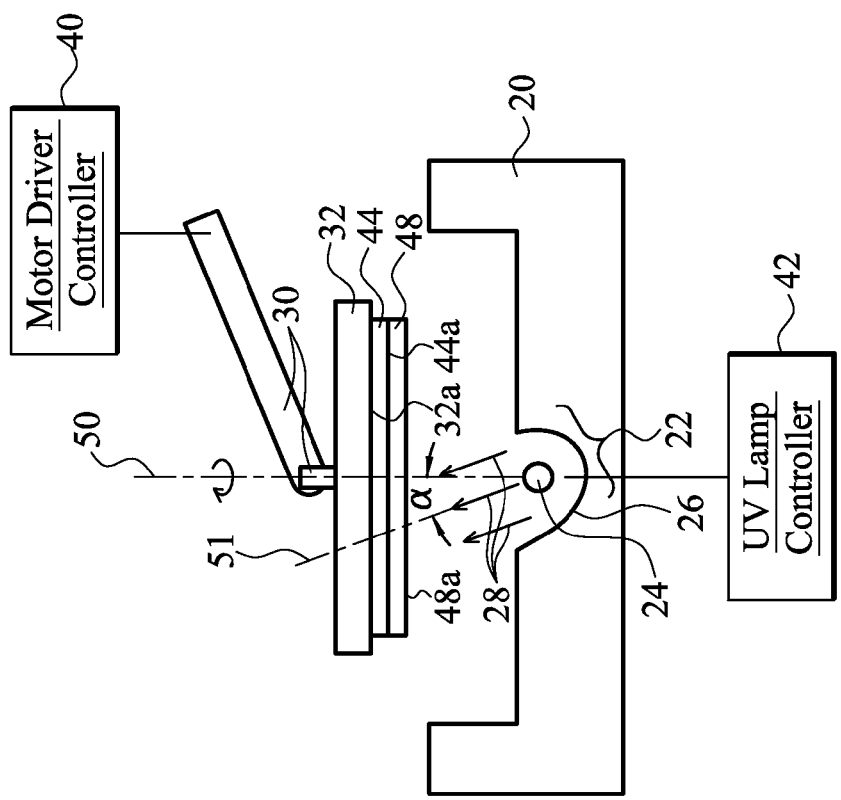
FIGS. 12 and 13 illustrate cross-sectional views of intermediate stages in the exposure of a UV tape in accordance with alternative embodiments, wherein the UV tape rotates, but does not move forward, during a UV exposure, and wherein the UV light is tilted.
Figure 13:
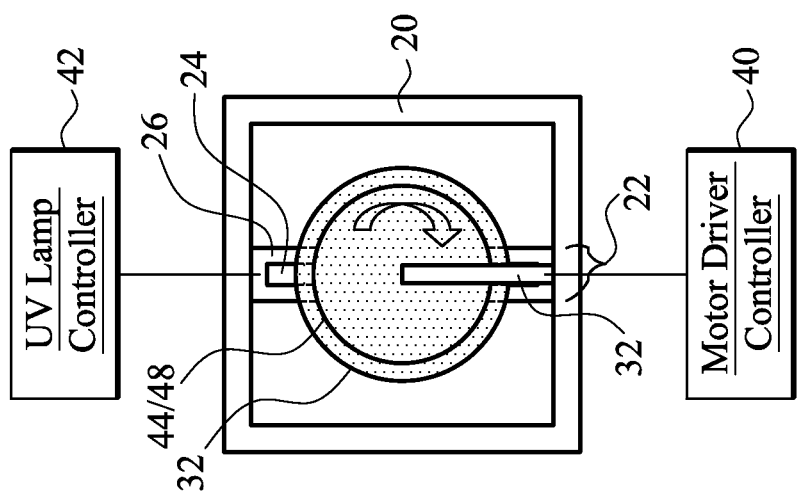

FIGS. 12 and 13 illustrate the light-exposure of UV tape 48 in accordance with yet other embodiments. In these embodiments, UV light 28 is still tilt projected onto UV tape 48 with tilt angle α, with UV tape 48 not moved horizontally in the entire light exposure process. The tilt exposure, however, is again achieved by tilting the main UV light direction of UV light 28. Referring to FIG. 12, UV lamp 22 is located in UV lamp module 20, with UV light 28 being tilt projected. The main UV light direction 51 of UV light 28 and axis 50 of the rotation form tilt angle α. Further, axis 50 may be parallel to the vertical direction, and parallel to main surfaces 32a, 44a, and 48a of stage 32, wafer 44, and UV tape 48, respectively. Stage 32, wafer 44, and UV tape 48 are disposed over UV lamp 22, and subject to the exposure of UV light 28. During the entire UV light exposure process, stage 32, wafer 44, and UV tape 48 may make one or more rotations. After UV tape 48 is exposed to UV light 28 for a desirable period of time. The UV light exposure step may be ended. UV tape 48 may then be removed from wafer 44. The projection of UV light 28 may also be shown using FIG. 7, which illustrates that UV light 28 is projected onto UV tape 48 from multiple angles. FIG. 13 illustrates a top view of the embodiment as shown in FIG. 12.

In the above-discussed embodiments, one of UV lamp 22 and UV tape 48 is tilted to cause the tilt light exposure. In alternative embodiments, both UV lamp 22 and UV tape 48 may be tilted, and the relative angle of UV light 28 and UV tape 48 will decide the tilt angle between UV light 28 and the main surface of UV tape 48.

The light exposure step using the light-exposure apparatus may be performed after wafer 44 is thinned in a backside grinding step (not shown), during which thinning process UV tape 48 is attached to the front side of wafer 44, while the backside of wafer 44 is grinded. The light-exposure apparatus as illustrated in FIGS. 1 through 13 may be integrated with the apparatus (not shown) used for performing the backside grinding. Alternatively, the light-exposure apparatus as illustrated in FIGS. 1 through 13 may be an equipment physically separated with the apparatus (not shown) used for performing the backside grinding.

In accordance with embodiments, a method of forming an integrated circuit includes providing a wafer, with a tape adhered to the wafer, wherein the tape has a main surface perpendicular to a direction. The tape is exposed to a light to cause the tape to lose adhesion. In the step of exposing the tape, the wafer and the tape are rotated, and/or the light is tilt projected onto the tape, wherein a main projecting direction of the light and the direction form a tilt angle greater than zero degrees and less than 90 degrees.

In accordance with other embodiments, a method includes mounting the a onto a stage, wherein a UV tape is adhered to the wafer; rotating the wafer and the tape around an axis; and exposing the UV tape to a UV light when the wafer and the tape are rotated. During the exposure of the UB tape, a main projecting direction of the UV light and the axis form a tilt angle greater than zero degrees and less than about 45 degrees.

In accordance with yet other embodiments, an apparatus for exposing a UV tape adhered onto a wafer is provided. The apparatus includes a stage configured to have the wafer mounted thereon, wherein the stage has a main surface perpendicular to a first direction. A UV lamp is configured to emit a UV light in a main UV light direction, wherein the apparatus is configured to rotate the stage, or the main UV light direction and the first direction form a tilt angle greater than zero degrees and smaller than 90 degrees.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   providing a wafer, and a tape adhered to the wafer, wherein the tape comprises a main surface perpendicular to a first direction; and
   exposing the tape to a light to cause the tape to lose adhesion, wherein the step of exposing the tape comprises tilt projecting the light onto the tape with a main projecting direction of the light and the first direction forming a tilt angle greater than zero degrees and less than about 45 degrees.

2. The method of claim 1, wherein the tape is a ultra-violet (UV) tape, and wherein the light is UV light.

3. The method of claim 1, wherein the step of exposing the tape comprises rotating the wafer and the tape when the tape is exposed to the light.

4. A method comprising:
   mounting a wafer onto a stage, wherein a ultra-violet (UV) tape is adhered to the wafer;
   rotating the wafer and the tape around an axis; and
   exposing the UV tape to a UV light when the wafer and the tape are rotated, wherein a main projecting direction of the UV light and the axis form a tilt angle greater than zero degrees and less than about 45 degrees.

5. The method of claim 4, wherein the step of exposing the UV tape comprises:
   positioning the wafer and the UV tape on one side of the UV light, with the UV tape not exposed to the UV light;
   moving the wafer and the UV tape to expose the UV tape to the UV light; and
   moving the wafer and the UV tape until the UV tape is not exposed to the UV light.

6. The method of claim 5, wherein the stage is connected to a transfer arm, and wherein during the step of exposing the tape, the transfer arm moves along a movement guide.

7. The method of claim 5, wherein a movement direction of the wafer and the tape and a main surface of the UV tape form the tilt angle.

8. The method of claim 5, wherein the main projecting direction of the UV light is perpendicular to a movement direction of the wafer.

9. The method of claim 5, wherein a movement direction of the wafer is parallel to a main surface of the UV tape, and wherein the main projecting direction of the UV light and the axis form the tilt angle.

10. The method of claim 4, wherein during the step of exposing the UV tape, the wafer and the UV tape have no horizontal movement.

11. The method of claim 4, wherein the tilt angle is between about 10 degrees and about 45 degrees.

12. An apparatus for exposing a ultra-violet (UV) tape adhered onto a wafer, the apparatus comprising:
   a stage configured to have the wafer mounted thereon, wherein the stage comprises a main surface perpendicular to a first direction;
   a transfer arm connected to the stage, wherein the transfer arm is configured to rotate the stage;

a movement guide, with the transfer arm configured to move along the movement guide, and to move from one side of the movement guide to reach an opposite side, wherein the transfer arm is further configured to rotate the stage when the transfer arm moves along the movement guide; and a UV lamp configured to emit a UV light in a main UV light direction, wherein the apparatus is configured to rotate the stage, or the main UV light direction and the first direction form a tilt angle greater than zero degrees and smaller than 90 degrees.

13. The apparatus of claim 12, wherein the transfer arm is configured to move in a second direction, and wherein the second direction and the main surface of the stage form the tilt angle.

14. The apparatus of claim 12, wherein the transfer arm is configured to move in a second direction parallel to the main surface of the stage, and wherein the main UV light direction and the first direction form the tilt angle.

15. The apparatus of claim 12 further comprising a motor drive controller coupled to, and configured to control, a rotation of the stage.

16. The apparatus of claim 12, wherein the tilt angle is smaller than about 45 degrees.

* * * * *